United States Patent [19]

Cirkel et al.

[11] Patent Number: 4,635,267
[45] Date of Patent: Jan. 6, 1987

[54] EXCITATION SYSTEM FOR GENERATING A FAST PULSED HIGH-VOLTAGE DISCHARGE, PARTICULARLY FOR EXCITING A HIGH-POWER LASER

[75] Inventors: Hans-Jürgen Cirkel; Willi Bette, both of Erlangen, Fed. Rep. of Germany

[73] Assignee: Kraftwerk Union Aktiengesellschaft, Mülheim, Fed. Rep. of Germany

[21] Appl. No.: 546,899

[22] Filed: Oct. 31, 1983

[30] Foreign Application Priority Data

Nov. 2, 1982 [DE] Fed. Rep. of Germany ....... 3240372

[51] Int. Cl.$^4$ .............................................. H01S 3/097
[52] U.S. Cl. ......................................... 372/38; 372/83
[58] Field of Search ...................... 372/83, 38; 307/415

[56] References Cited

U.S. PATENT DOCUMENTS 4,275,317 6/1981 Laudenslager et al. ............ 307/415
4,365,337 12/1982 Cirkel et al. .......................... 372/87

FOREIGN PATENT DOCUMENTS 2932781 2/1981 Fed. Rep. of Germany .
3035702 4/1982 Fed. Rep. of Germany .

OTHER PUBLICATIONS

Publication Proceedings IEE, London, 1951, vol. 38, Part 3, pp. 185–207.
Scientific American, Apr. 1980, pp. 84–96.

Primary Examiner—James W. Davie
Attorney, Agent, or Firm—Herbert L. Lerner; Laurence A. Greenberg

[57] ABSTRACT

An excitation system for generating a fast pulsed high-voltage discharge into a load, especially for exciting a high-power laser, by an arc-free capacitor discharge which is as homogeneous as possible. The system includes a laser chamber wherein two laser electrodes are oppositely located and spaced from one another, and extending parallel to an optical axis of the laser chamber; and a high voltage supply unit; a pulse forming network which further includes, in a shunt branch connected in series with the stripline capacitors, at least one fast high-voltage switching element, which, due to its activation the high-voltage pulses are generated at the laser electrodes. The fast high-voltage switching element is formed as a saturable magnetic reactor having a magnetizing current which makes the reactor go into saturation if the charging voltage at the stripline capacitors has come into the vicinity of the peak thereof, and wherein the shunt branch of the laser chamber includes a series circuit containing a respective stripline capacitor and the laser chamber itself.

17 Claims, 10 Drawing Figures

EXCITATION SYSTEM FOR GENERATING A FAST PULSED HIGH-VOLTAGE DISCHARGE, PARTICULARLY FOR EXCITING A HIGH-POWER LASER

BACKGROUND OF THE INVENTION

1. Field of the Invention

The invention of the instant application relates to an excitation system for generating a fast pulsed high-voltage discharge to a load, particularly for exciting a high-power laser by an arc-less capacitor discharge as homogeneously as possible, the system having a laser chamber with a gas space wherein at least two laser electrodes are disposed opposite and spaced from one another, the electrodes extending parallel to an optical axis of the laser chamber; a high voltage supply unit; and a pulse-forming network connectible on the input side to the high-voltage supply unit and connected on the output side to the laser electrodes, and having serially connected first and second stripline capacitors connected in parallel with an electrode path of the laser, as well as series and shunt inductances.

2. Description of the Prior Art

Such an excitation system is know from German Published Non-Prosecuted Application (DE-OS) No. 29 32 781. TE-lasers (TE=transversely excited) preferably used in this connection have achieved particular importance because of their high peak powers and large pulse energies. In such lasers, the laser gas which is at high pressure (50 mbar to several bar) as compared to longitudinally excited gas lasers is excited by a homogeneous electrical discharge at several kV via two extended electrodes which are disposed opposite one another and parallel to the optical axis (the direction of emission of the laser). Regarding further details, reference is made to the aforecited German Published Application.

Suitable preionization devices for the excitation system of the foregoing general type are described particularly in German Published Non-Prosecuted Applications (DE-OS) No. 30 35 730 and (DE-OS) No. 30 35 702. It is assumed herein that excitation systems of the foregoing general type are equipped with preionization devices; for this reason, it is not necessary to show them within the scope of the present application.

The excitation system of the type defined at the outset hereto relates, as mentioned, preferably to TE-lasers, for example, to $CO_2$-lasers or eximer lasers which represent light sources which, as indicated hereinbefore, are being used in numerous technical applications because of the high efficiency and large output energy per pulse thereof. In these pulse systems efforts are made to switch electric energies in the order of one kilojoule at repetition rates of approximately one kHz in fractions of a microsecond. Spark gaps and thyratrons are used as switches for high voltages and large currents with the short switching times required for the aforementioned laser systems. To date, technical constructions of these switching elements which meet the specified strict requirements simultaneously with long life have not yet become known.

Even since the beginning of the fifties, switching elements which are constructed from saturable inductors have become known from radar technology (Melville: "The use of Saturable Reactors as Discharge Devices for Pulse Generators", Proceedings IEE, London 1951, Vol. 98, Part 3, Pages 185–207). The saturable reactors are used to switch large currents with high current rates of rise. They have purely metallic current conduction which is not subject to the wear and mechanisms such as occur in spark gaps and thyratrons. The use of saturable magnetic reactors therefore has advantages in technical applications wherein long life is required.

The manufacture, composition and properties of the ferro-magnetic core material for such reactors ("metallic glass") is reported, for example, in the journal "SCIENTIFIC AMERICAN", April 1980, pages 84 to 96; reference may also be made to U.S. Pat. No. 4,275,317.

From the aforementioned U.S. Pat. No. 4,275,317, it is known to employ saturable reactors in a special pulse-forming network which is suited for exciting TE-lasers. As will be explained hereinafter in greater detail with reference FIGS. 1 and 2, it is a disadvantage in this pulse-forming network that the entire laser current and therefore, the entire energy converted in the laser must flow through the saturable reactor connected in series with the laser chamber, the saturable reactor retaining, in the saturated state, particularly at large electric energies to be switched, an especially large residual inductance. This residual inductance considerably increases the impedance of the laser discharge circuit as compared to such a circuit which is constructed only from the laser chamber and the charging capacitor. A large impedance is found to be detrimental to an effective excitation of the laser gas.

SUMMARY OF THE INVENTION

It is an object of the invention to avoid the aforedescribed difficulties and to provide an excitation system for generating the fast pulsed high-voltage discharge to a load, particularly for exciting a high-power laser, wherein a series circuit of the saturable magnetic reactor and the load, in general, and the electrode path of a high-power laser, in particular, is avoided. To solve this problem, the invention initially starts out from the heretofore known excitation system described in the introduction hereto and, in substance, in German Published Non-Prosecuted Application (DE-OS) No. 29 32 781, and develops this excitation system further in accordance with the features of the invention in this application by the measures that the fast high-voltage switching element connected into a shunt branch is constructed as a saturable magnetic reactor, the magnetizing current of which makes the reactor go into saturation if the charging voltage at the stripline capacitors has come into the range of the peak value thereof, the term shunt branch of the laser chamber meaning the series circuit of a stripline capacitor $C_2$ or $C_1^*$, respectively, and the laser chamber itself.

The advantages attainable with the invention are, especially, that only now, the saturable magnetic reactor with the advantageous properties thereof is fully utilized without an excitation system because, as an inductive reactance which is no longer connected in series with the laser electrode path, it can affect with appropriate construction the high voltage discharge of the laser only to a negligible degree.

With the foregoing and other objects in view, there is provided, in accordance with the invention, an excitation system for generating a fast pulsed high-voltage discharge into a load, especially for exciting a high-power laser, by an arc-free capacitor discharge which is as homogeneous as possible, the system having:

(a) a laser chamber with a gas space wherein at least two laser electrodes are disposed opposite and spaced from one another, the electrodes extending parallel to an optical axis of the laser chamber, and preferably having a solid cross section extending in direction of the optical axis;

(b) a high voltage supply unit; and (c) a pulse-forming network (c1) connectible on the input side to the high-voltage supply unit and connected on the output side to the laser electrode;

(c2) having serially connected first and second stripline capacitors connected in parallel with an electrode path of the laser, as well as series and shunt inductances;

the pulse-forming network further comprising, in a shunt branch connected in series with the stripline capacitors, at least one fast high-voltage switching element, due to the activation of which via the pulse-forming network, the high voltage pulses at the laser electrodes are generatable, the fast high-voltage switching element being formed as a saturable magnetic reactor having a magnetizing current making the reactor go into saturation if the charging voltage at the stripline capacitors has come into vicinity of the peak value thereof, the shunt branch of the laser chamber being a series circuit containing a respective stripline capacitor and the laser chamber itself.

Other features which are considered as characteristic for the invention are set forth in the appended claims.

Although the invention is illustrated and described herein as embodied in an excitation system for generating a fast pulsed high-voltage discharge, particularly for exciting a high power laser, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

DESCRIPTION OF THE PREFERRED EMBODIMENTS

Figure 1:
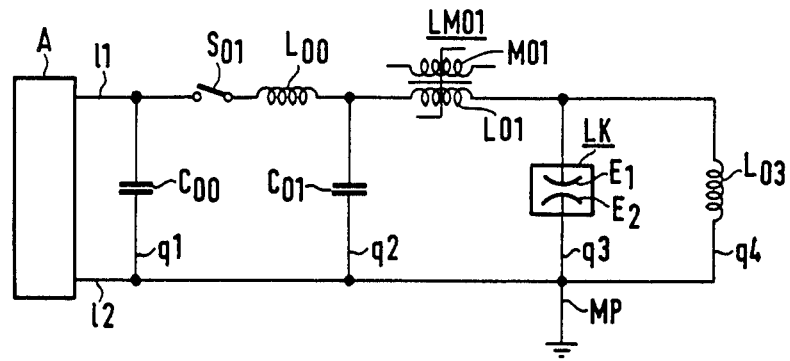
FIG. 1 is a circuit diagram of a simplified pulse-forming network in the state of the art constructed according to the teachings of U.S. Pat. No. 4,275,317 with a saturable magnetic reactor LM 01 arranged in a series branch for switching the excitation energy of the laser chamber LK.

Referring now to the drawing and, for a better understanding of the invention, the simplified embodiment of a heretofore known excitation system according to U.S. Pat. No. 4,274,317 will be explained first, hereinafter, making reference to FIG. 1. In FIG. 1, a high-voltage supply unit A is shown generally supplying d-c voltage to which the two series branches 11 (plus bus) and 12 (ground bus) are connected, the plus bus being connected via a high-voltage switch $S_{01}$, a non-saturable choke $L_{00}$ and, as a first further choke, via the working winding L 01 of a saturable magnetic reactor LM 01 (with a control winding M 01 on the secondary side) is connected to the one electrode $E_1$ of the laser chamber LK, the ground bus 12 being connected to the counter-electrode $E_2$ of the laser chamber LK. The working and the control windings may, however, each be made up of only one turn which may be formed especially of the plus and the ground bus. A ground terminal MP is also provided. The intermediate-storage capacitor $C_{00}$ is connected in a first shunt branch q1 yet ahead of the switch $S_{01}$, and the charging capacitor $C_{01}$ in a second shunt branch q2 between the choke $L_{00}$ and the reactor LM 01. Parallel to the laser chamber LK disposed in the third shunt branch q3, a further non satuable choke $L_{03}$ is also connected in a further fourth shunt branch q4. By closing the switch $S_{01}$, the storage capacitor $C_{01}$ is charged-up by the high-voltage supply unit A with the intermediate-storage capacitor $C_{00}$ via the choke $L_{00}$ in a resonant charge to a peak voltage value, just at which the reactor LM 01 goes into the saturated state.

The magnetizing current required therefor flows through the nonsaturable choke $L_{03}$ past the laser electrodes $E_1$, $E_2$. The voltage drop at the choke $L_{03}$ must be kept smaller than the breakdown voltage of the laser chamber LK during the magnetization phase. Only after the reactor LM 01 is saturated, is the charging voltage of the capacitor $C_{01}$, which is considerably above the breakdown voltage, present at the laser electrodes $E_1$, $E_2$, and the capacitor $C_{01}$ is discharged via the hardly negligible residual inductance of the reactor LM 01 connected in series into the plasma which is developed between the laser electrodes $E_1$ and $E_2$.

The pulse length of the discharge current is determined by the inductance of the reactor LM 01 in the saturated state and by the capacitor $C_{01}$. The pulse length for charging up the capacitor $C_{01}$, on the other hand, is defined by the inductance $L_{00}$ and the series circuit of the capacitors $C_{00}$ and $C_{01}$.

According to experience, the charging time can be extended by the inductance of the choke $L_{00}$ up to a factor of 10 as compared to the discharge time. The ratio of the charging time to the discharging time is called the compression factor. It is determined by the properties of the magnetic material as well as by the geometric configuration of the reactor LM 01 serving as the switching element.

In order that the inductance change of the reactor LM 01 may always be utilized in full, a secondary winding M01 designated as the control winding at the outset hereto is provided, via which the magnetic material is returned in the pulse pause by a continuous or pulsed d-c current to saturation with the opposite polarity. During the charging phase of the capacitor $C_{01}$, a current flows through the switch $S_{01}$ due to the preservation of charge which is lower by the compression factor than the current in the laser excitation circuit and in the shunt branch q3, respectively. For simplification, reference will be made hereinafter to a reactor LM 01 or LM 02 and not to the working and control windings.

Figure 2:
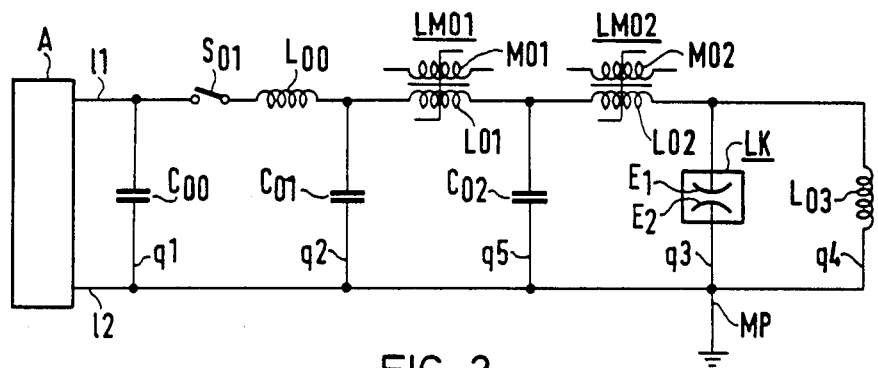
FIG. 2 is a circuit diagram of the network of FIG. 1 expanded by a further reactor LM 02 in the series branch and a charging capacitance $C_{02}$ in the shunt branch.

A further reduction of the current to be switched by the switch $S_{01}$ is possible by the circuit according to FIG. 2. Like parts are identified by the same reference characters. In FIG. 2, a further saturable magnetic reactor LM 02 is inserted between the reactor LM 01 and the terminal of the shunt branch q3 and, a further intermediate capacitor $C_{02}$ which is wired as a further shunt branch q5 by the other pole thereof to the ground bus 12 is connected to a connection point of the series branch 11 between the two reactors LM 01 and LM 02. In this regard, the intermediate capacitor $C_{02}$ is charged by the reactor LM 01 to a voltage peak value at which the further reactor LM 02 comes to saturation and then discharges the capacitor $C_{02}$ into the laser chamber LK. By interposing the switching elements $C_{02}$ and LM 02, further pulse compression is attained.

As mentioned hereinbefore at the introduction hereto, the pulse compression circuits according to FIGS. 1 and 2 have a considerable disadvantage:

The entire laser current and therefore the entire energy converted in the laser chamber LK must flow through the chokes (reactors LM 01 and LM 02, respectively) connected in series with the chamber LK, the reactors retaining a considerable residual inductance in the saturated state when the electrical energies to be switched are high. This residual inductance considerably increases the impedance of the laser discharge circuit as compared to a circuit which would consist only of the laser chamber LK and the capacitor $C_{01}$. A large impedance is found to be detrimental for an effective excitation of the laser gas.

By means of the invention, the foregoing disadvantages of using saturable magnetic reactors are largely avoided; this will be explained hereinafter first, by reference to the first embodiment of FIG. 3. The invention starts out from there with an excitation system for generating a fast pulse-type voltage discharge in a load, especially for exciting a high-power laser, by means of an arc-free capacitor discharge as homogeneous as possible, as is described in German Published Non-Prosecuted Application (DE-OS) No. 29 32 781 and in further constructions, for example, in co-pending patent applications Ser. Nos. 484,621 and 484,622, filed Apr. 13, 1983 assigned to the same corporate assignee as that of the instant application. Suitable preionizing devices for such excitation systems are described in German Published Non-Prosecuted Application (DE-OS) No. 30 35 730 and (DE-OS) No. 30 35 702; they will not be described herein because they are not necessary for an understanding of the invention of the instant application.

Figure 3:
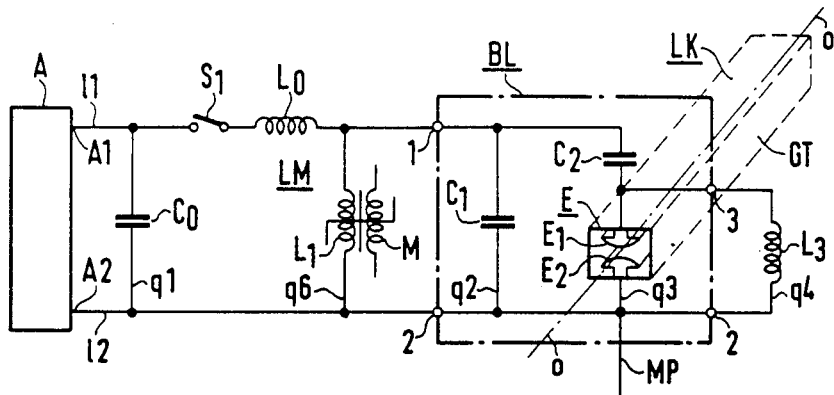
FIG. 3 is a circuit diagram of a first embodiment of the excitation system according to the invention wherein the pulse-forming network is based on a Blümlein circuit BL (shown in the box formed with broken lines) and the reactor LM is arranged in a shunt branch.

The laser chamber LK shown in FIG. 3 is preferably a TE-laser with at least two laser electrodes $E_1$, $E_2$ which are arranged opposite one another in the gas space of the laser chamber LK at a spaced distance from one another and which, as indicated in a perspective view by broken lines, always extend parallel to the optical axis O of the laser chamber LK and preferably have a solid cross section E extending in this direction. The laser chamber LK is understood to means the laser electrodes $E_1$, $E_2$ with the gas tank GT, wherein they are hermetically enclosed and fastened. Wall parts of the gas tank can be realized as metallic current returns and can contain the electrical current feedthrough for the current supply. For the term "laser chamber", the term "laser head" is also used. As in FIG. 1 and FIG. 2, the following is provided: The high-voltage supply unit A, the series branches 11 (plus bus) and 12 (ground bus) connected thereto, the first to fourth shunt branches q1 to q4, whereby, however, the switching elements arranged therein are identified as $C_0$ (intermediate-storage capacitor), $C_1$ (first stripline capacitor), $C_2$ (second stripline capacitor in series with the laser chamber LK) and $L_3$ (choke with low impedance for the frequency of the charging current of the capacitor $C_2$ and high impedance with respect to the frequency of the laser discharge current). The shunt branch q3 of the laser chamber LK is understood herein to means the series circuit formed of the stripline capacitor $C_2$ and the laser chamber LK itself. The pulse-forming network PFN encompasses the circuit shown without the high voltage supply unit A, to the terminals A1 and A2 to which it is connected, and without the laser chamber LK. It includes the previously mentioned series-connected first and second stripline capacitors $C_1$, $C_2$ which are parallel to the laser chamber LK and the laser electrode path $E_1$–$E_2$, respectively, as well as the otherwise non-illustrated series and shunt conductances, which result especially from the intrinsic inductance of the laser chamber LK, the feeds thereof and of the stripline capacitors $C_1$, $C_2$. By the rectangular box BL shown in broken lines there is expressed that the laser chamber LK and the stripline capacitors $C_1$, $C_2$ thereof are arranged in a Blümlein circuit which thus forms part of the pulse-forming network PFN. The fast high-voltage switching element which is then connected in a shunt branch q6 was identified as a given shunt branch and is in series with the stripline capacitors $C_1$, $C_2$ and, through the activation of which (as explained in detail in German Published Non-Prosecuted Application DE-OS No. 29 32 781), the high-voltage pulses at the laser electrodes $E_1$, $E_2$ can be generated via the pulse-forming network PFN, is constructed according to the invention as a saturable magnetic reactor LM, the magnetizing current of which makes the reactor LM go into saturation if the charging voltage at the stripline capacitors $C_1$, $C_2$ has reached the range of the peak value thereof. The reactor LM is understood to mean herein a saturable choke, which has at least one working or primary winding L and optionally, a control winding M. As mentioned hereinbefore, these windings may also be formed of only one turn.

The arrangement of the stripline capacitors $C_1$ and $C_2$ as well as the relation thereof to the laser chamber LK is, in particular, made so as is described in German Published Non-Prosecuted Application (DE-OS) No. 29 32 781, in order to obtain an arrangement which is as compact as possible. A conception of this compact arrangement is provided in FIG. 8, which is discussed in detail hereinafter. The manner of operation of the switch shown in FIG. 3 is as follows: From the high-voltage supply unit A with the intermediate capacitor $C_o$, the stripline capacitor arrangement $C_1$, $C_2$ is charged up within the Blümlein circuit BL thereof by closing the switch $S_1$. The charging time is chosen by the dimensioning of the non-saturable choke $L_o$ so that when the voltage peak is reached, the reactor LM just then reaches saturation. The charging current of the second stripline capacitor $C_2$ flows through the choke $L_3$, which is shunted across the laser chamber LK in the shunt branch q4. A voltage pulse (voltage drop at the non-saturable choke $L_3$) between the electrodes $E_1$ and $E_2$ occurs during the charging phase; precautions must be taken that this voltage drop does not have such a magnitude that it could ignite the gas discharge unintentionally. The magnetizing current of the reactor LM flows as a partial current past the excitation system formed by the Blümlein circuit BL. When saturation is reached, the capacitor $C_1$ reverses its charge via the reactor LM in an oscillating discharge to a peak voltage value with the opposite polarity, so that the capacitors $C_1$ and $C_2$ which were initially charged in parallel are connected in series and, neglecting losses, maximally twice the voltage occurs across the laser electrodes $E_1$ and $E_2$, and the laser chamber LK is ignited. The then series-connected capacitors $C_1$ and $C_2$ are discharged into the laser chamber, whereby the laser excitation current need not flow through the switching element LM, the residual inductance of which is considerably greater than the total inductance of the laser excitation circuit formed of the capacitors $C_1$, $C_2$ and the laser chamber LK. This small inductance has an extremely advantageous effect upon the effectiveness of the laser. In contrast with the arrangements shown in FIGS. 1 and 2, only the amount of energy stored in the capacitor $C_1$ must be transported through the saturated reactor LM during the charge reversal, while the sum of the amounts of energy stored in the capacitors $C_1$ and $C_2$ is fed to the laser chamber LK.

This property of the circuit turns out to be of special advantage since magnetic switches, as explained hereinbefore, have losses which cannot be neglected and which reduce the efficiency of the laser. A further reduction of the switching losses result if an asymmetrical Blümlein circuit is used, such as is described in the hereinafore-mentioned earlier co-pending application, Ser. No. 484,622.

A homogeneous discharge between the laser electrodes sets a maximally permissible voltage rise time at the laser chamber LK. In the excitation system of the Blümlein circuit BL, this rise time is defined by the residual inductance, respectively, of the working winding and the saturable choke $L_1$ and the capacity $C_1$. The charging time for the shunt circuit of the capacitors $C_1$ and $C_2$ is set by the inductance of the series choke $L_o$. For the charging time $t_{L1}$, the following equation applies:

$$t_{L1} = \pi \sqrt{L_0 \frac{C_0 \cdot (C_1 + C_2)}{C_0 + (C_1 + C_2)}}$$

Also, with the maximally possible pulse compression, the required charging time is relatively short and, therefore, the occurring peak current for the charging process is relatively high.

Figure 4:
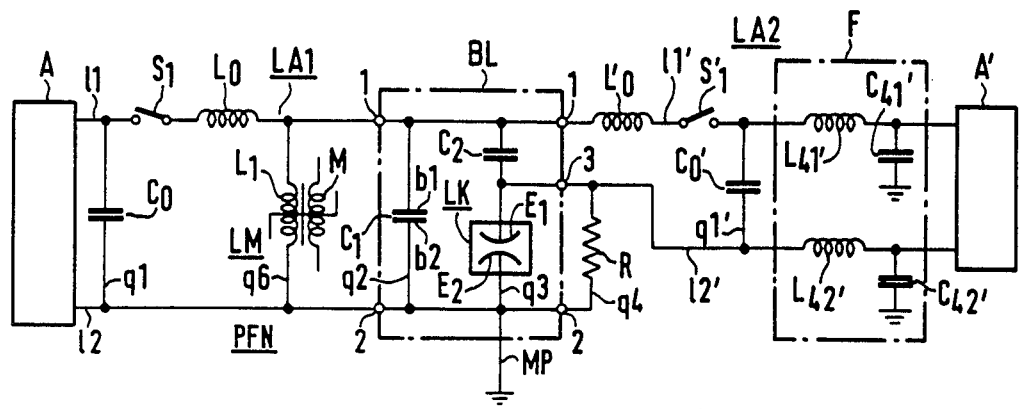
FIG. 4 is a circuit diagram of a second embodiment of the excitation circuit according to the invention, wherein the circuit according to FIG. 3 is enlarged by a second high-voltage supply unit A'.

In order (a) to lower the charging current further and (b) to prevent an undesired voltage drop from occurring at $L_3$ due to the charging current, an excitation system according to FIG. 4 can be used (second embodiment). As compared to FIG. 3, the arrangement in FIG. 4 is provided so that, in addition to the first high-voltage supply unit A, a second, similar high-voltage supply unit A' (right-hand part of FIG. 4) is connected to the Blümlein circuit BL of the pulse-forming network PFN via an intermediate-storage capacitor $C_o'$ in a shunt branch q1' and the series circuit formed of the switch $S_1'$ and the series choke $L_o'$ in an additional series branch 11' (the ground bus is logically identified by the reference character 12'). Specifically, the second high-voltage supply unit A' in particular, is connected via the series branches 11', 12' thereof to the two poles of the second stripline capacitor $C_2$ which is connected in series with the laser chamber LK and forms the shunt branch q3. The capacitors $C_1$ and $C_2$ are therefore charged up by two separate high-voltage supply units A and A' as well as the separate intermediate storage capacitors $C_o$ and $C_o'$ via the two switches $S_1$ and $S_1'$. The charging unit A' is decoupled a-c-wise form the high-voltage pulse occurring at the laser chamber LK via the lowpass filter arrangement F with the L-C arrangement and the filter chain of $C_{41}'$ in the series branch 11', respectively, as well as the L-C arrangement and the filter chain of $C_{42}'$ and $L_{42}'$, respectively, in the lower series branch $l_2'$. The two switches $S_1$ and $S_1'$ are fired simultaneously and the charging times are equalized via the chokes $L_o$ and $L_o'$. The resistor R can have a high resistance in this pulse-forming network; it keeps the laser electrodes at the same potential during the discharge pauses. To fire simultaneously, the switches $S_1$ and $S_1'$ are preferably electronic switches, for example, thyratrons which are equipped with control means for firing them simultaneously. If the high-resistivity resistor R is provided parallel to the laser chamber LK (as shown), the equation which is applicable in particular for the charging times $t_{L1}$ *of the first charging loop LA* 1 *and* $t_{L2}$ of the second charging loop LA 2 of the pulse-forming network PFN, is as follows:

$$t_{L2} = \pi \sqrt{L_0' \frac{C_0' \cdot C_2}{C_0' + C_2}} = t_{L1} = \pi \sqrt{L_0 \frac{C_0 \cdot C_1}{C_0 + C_1}}.$$

Thus, in fact, the capacitor $C_2$ is charged considerably through the charging loop LA 2 of the second supply unit A'; it is no longer necessary to conduct the charging current of this capacitor through a low-impedance choke $L_3$ as in FIG. 3. Due to the dual feed, the charging time $t_L$ can be shortened without danger of a premature pulse across the electrodes $E_1$ and $E_2$ whereby, due to the hereinaforementioned matching of the charging times of the two charging loops, assurance is afforded that the reactor LM will acually switch at the voltage peak of the BLümlein circuit BL.

Figure 5:
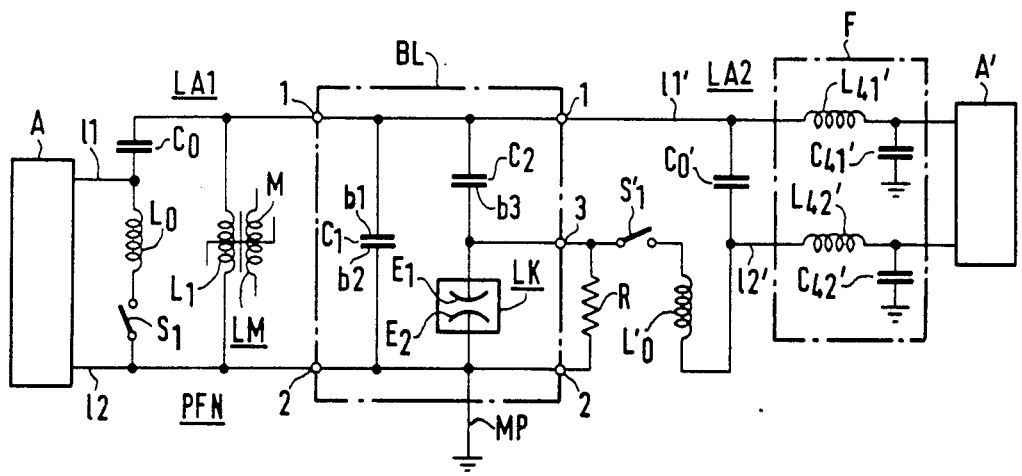
FIG. 5 is a circuit diagram of a third embodiment of an excitation system, wherein, however, the switching elements $S_1$, $L_0$ and $C_0$ of the high-voltage supply unit A as well as the switching elements $S_1'$, $L_0'$ and $C_0'$, of the second high-voltage supply unit A' have been regrouped for obtaining a particular switching characteristic.

In the third embodiment according to FIG. 5, which is likewise based on a Blümlein circuit BL, the circuit according to FIG. 4 is modified by interchanging the intermediate storage capacitor $C_o$ and the series circuit formed of the switch $S_1$ and the series choke $L_o$ in such a manner that the switch $S_1$ then has one pole at ground potential and the series circuit of $C_o$, $L_o$ and $S_1$ is connected parallel to the reactor LM and, consequently, parallel to the first stripline capacitor $C_1$. Furthermore, the series circuit formed of the switch $S_1'$ and the series choke $L_o'$ from the "upper" series branch 11' at plus potential is transposed within the second charging loop LA 2 into the "lower" series branch 12' connected to ground MP via the impedance R shunted across the laser in such a manner that, in accordance with the component sequence $S_1$-$L_o$-$C_o$-$C_1$-$S_1$ of the first charging loop LA 1, the component sequence $S_1'$-$L_o'$-$C_o'$-$C_2$-$S_1'$ of the second charging loop LA 2 is obtained. This circuit offers the possibility of using as the switch $S_1$ a thyratron which is at ground potential on one side, which is technically simpler to drive. This advantage could be realized, of course, by an appropriate interchange of the switching elements $S_1$, $L_o$, on the one hand, and $C_o$, on the other hand, in the circuit according to FIG. 3.

Figure 6:
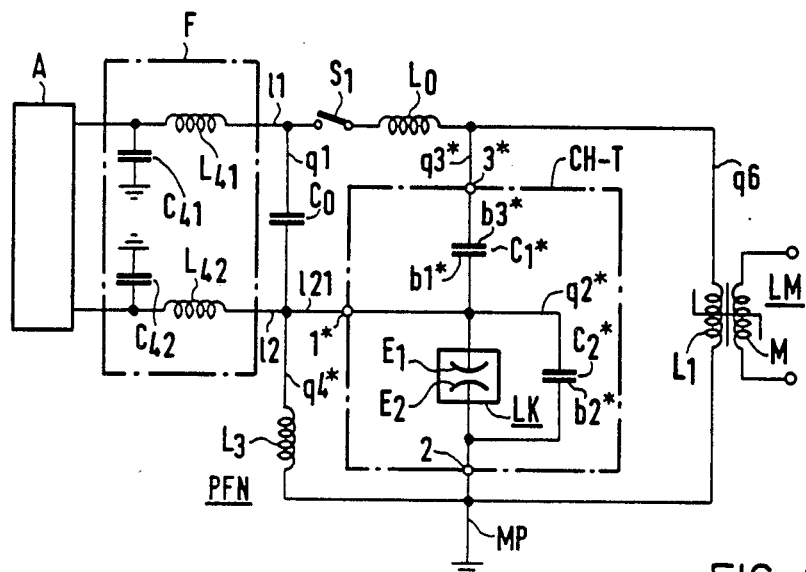
FIG. 6 is a circuit diagram of a fourth embodiment of the excitation system with a pulse-forming network which is based upon a charge transfer circuit, the magnetic reactor being likewise maintained as switching element at ground potential on one side, also in the case of switching.
Figure 7:
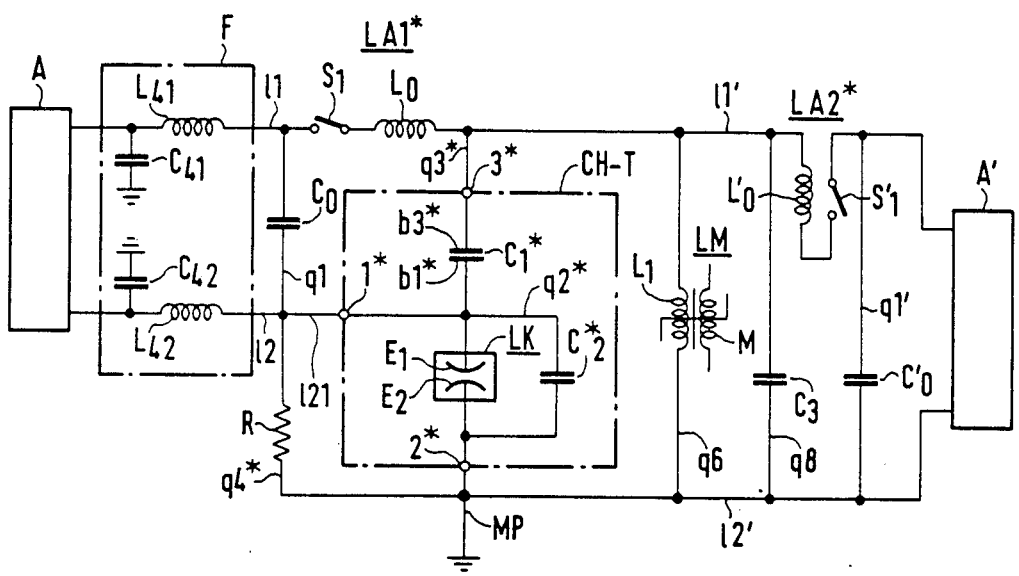
FIG. 7 is a circuit diagram of the excitation system according to FIG. 6, but enlarged, however, by the connection of an additional high-voltage supply unit A'.

The excitation system according to FIG. 6 (fourth embodiment) is based on a charge transfer circuit CH-T. In a first approximation, this circuit can be visualized as having been obtained by interchanging, in the Blümlein circuit according to FIG. 3, the laser chamber LK and the circuit element in the form of the reactor LM. A saturable magnetic reactor can also be used satisfactorily as a switching element in a charge transfer circuit if it is arranged in a shunt branch q6, as shown in FIGS. 6 and 7. The charge-transfer CH-T per se is emphasized by rectangular boxes shown in broken lines; the entire pulse-forming network is again identified by the reference characters PFN. The first stripline capacitor connected in the shunt branch q3* in series with the laser chamber LK is identified by reference character $C_1$* and the second stripline capacitor, which is connected into the shunt branch q2* in parallel with the laser chamber LK, by reference character $C_2$*. The combination of the laser chamber LK with the stripline capacitor $C_2$ (FIGS. 3 to 5) and $C_1$*, respectively, (FIGS. 6 and 7) connected in series with the laser chamber LK makes sense because in the mechanical construction of the excitation system (note FIG. 8), the stripline capacitors from a compact structural unit with the laser chamber, the length of the leads serving to make the switching connection being reduced to a minimum for the purpose of minimizing the stray inductance. In this case, the high-voltage supply unit A is decoupled a-c-wise from the high voltage pulse occurring at the laser chamber LK and the stripline capacitor $C_1$* connected in series therewith via lowpass filters F formed of the two filter chains $C_{41}$—$L_{41}$ in the upper series branch 11 and $C_{42}$—$L_{42}$ in the lower series branch 12. Analogously to the circuit according to FIG. 3 or FIG. 4, the power supply unit A is again coupled via an intermediate-storage capacitor $C_o$ in the shunt branch q1 and the high voltage switch $S_1$ with the series choke $L_o$ connected in series therewith in the upper series branch 11. The filter chain circuit F is preferably required, as also in the case of FIGS. 4 and 5, if the high-voltage supply unit A and A', respectively, is coupled via the upper and lower series branch 11. 12 to a stripline capacitor $C_1$* (and, respectively, in the case of FIGS. 4 and 5 to the stripline capacitor $C_2$).

The intermediate-storage capacitor $C_o$ is charged up by the high-voltage supply unit A. When the switch $S_1$ is closed, the capacitor $C_1$* is charged via the series choke $L_o$ in resonance charge. A small partial current flows through the reactor LM and the choke $L_3$ which is connected in series therewith but parallel to the laser chamber in the branch q4* back via the partial branch $12_1$ to the capacitor $C_o$. The charging time $$t_L = \pi \sqrt{L_0 \frac{C_1^* \cdot C_0}{C_1^* + C_0}}$$

is again selected just so that the reactor LM is saturated when the voltage peak value is reached at the stripline capacitor $C_1$*. The voltage drop at the choke $L_3$ is relatively small as compared to the peak voltage value, so that during the charging and magnetizing phase, only a small voltage pulse can occur at the laser chamber LK. When the saturation of the reactor LM is attained, the latter changes to a state of minimum inductance, so that the capacitor $C_1$* charges the capacitor $C_2$* (the so-called charge transfer after which the circuit is named). The charging of the capacitor $C_2$* leads to a voltage pulse across the laser chamber LK which causes the development of a plasma between the electrodes $E_1$ and $E_2$. As mentioned hereinbefore, the lowpass filter F protects the supply unit A from the high-frequency high-voltage pulses that occur.

Through a second d-c feed with the high-voltage supply unit A' according to FIG. 7, the advantage is achieved also in an excitation system with a charge transfer circuit that the voltage drop at the choke $L_3$ across the laser chamber LK (according to FIG. 6) is avoided during the charging phase. As compared to the circuit according to FIG. 6, a second similar high-voltage supply unit A' is connected, in the embodiment according to FIG. 7, additionally to the first high-voltage supply unit A via an intermediate-storage capacitor $C_0'$ in a shunt branch q1 and, via a series circuit formed of the switch $S_1'$ and the series choke $L_0$, in one series branch L1' as well as preferably of an additional capacitor $C_3$ in a further shunt branch q8 to the shunt branch q6 of the reactor LM. The impedance shunted across the laser chamber LK is thereby again large and, in comparison with the choke $L_3$ according to FIG. 6, has a high resistivity R which can be large for the reason that now the magnetizing current for the reactor LM no longer needs to flow through the impedance R. As compared to FIG. 6, like parts in FIG. 7 again are identified by the same reference characters.

Within the second charging loop LA 2*, the capacitor $C_3$ is charged up by the capacitor $C_0'$. The voltage waveform is set identical to that at the capacitor $C_1$*. A small partial current flows through the reactor LM as a magnetizing current. The impedance in the form of a high resistance R has thereby again only the purpose of keeping the laser electrodes $E_1$ and $E_2$ at the same potential during slow voltage changes.

Also in this excitation system according to FIG. 7, it is very important that the charging time of the relatively low-power circuit, which is to supply only the magnetizing current (charging loop LA 2*), is matched to the charging time of the high-power charging circuit (charging loop LA 1*). If the charging time of the second charging loop LA2* is represented by $t_{L2}*$ and the charging time of the first charging loop LA1* by $T_{L1}*$, there is obtained, at least in a first approximation:

$$t_{L2}* = t_{L1}* = \pi \sqrt{L_0' \frac{C_0' \cdot C_3}{C_0' + C_3}} = \pi \sqrt{L_0 \frac{C_1* \cdot C_0}{C_1* + C_0}}.$$

The stored energy in the capacitor $C_0'$ is chosen somewhat larger than the required magnetization energy. The formula given above applies preferably under the assumption that the switches $S_1$ and $S_1'$ are electronic switches which are provided with control means for simultaneous firing thereof, so that the reactor LM then goes into saturation if the charging voltage at the stripline capacitors $C_1*$ and $C_3$ has reached the vicinity of the peak value thereof.

Of special importance is a low residual inductance of the saturable magnetic reactor LM, also called a magnetic switch, which can be preset by geometric arrangement and the residual permeability of the tapes or laminations used for the iron core. A practical construction is, as mentioned, one wherein the energy $C_0' \cdot U^2/2$ stored in the additional charging loop LA 2* is chosen somewhat greater than the energy $L \cdot I^2/2$ required for magnetizing the reactor LM, wherein I is the magnetizing current, L the inductance of the reactor LM in the unsaturated state, and U the charging voltage of the capacitor $C_0'$ having the capacitance $C_0'$.

In FIG. 3, the two terminals of the reactor LM with respect to the Blümlein circuit BL are identified by reference numerals 1 and 2; the terminals of the choke $L_3$ by reference numerals 3 and 2 (the two terminals 2, 2 of the reactor LM and of the choke $L_3$ have the same potential since they are arranged within the ground bus 12). These terminals, marked by small circles, could also be considered as fictitious interfaces of the Blümlein circuit BL, shown by a box in broken lines, with the rest of the pulse-forming network PFN. A logical identification of the terminals is provided in FIG. 4, wherein the terminals are identified clockwise by reference numerals 1, 1, 3, 2, 2 (an additional terminal 1 is provided because of the second charging loop LA2). A corresponding identification of the terminals results from FIG. 5. Contrary to the circuits shown in FIG. 3 to FIG. 5, the two excitation systems shown in FIGS. 6 and 7 do not represent Blümlein circuits, but rather charge transfer circuits within the networks PFN thereof, for which reason the designation or identification of the terminals is effected also somewhat differently, namely clockwise in FIG. 6 by reference characters 3*, 2* and 1*, the terminals 3*, 2* being the two terminals of the reactor LM with respect to the charge transfer circuit CH-T, and the terminals 1*, 2* being the two terminals of the choke $L_3$. A logical designation or identification of the terminals 3*, 2*, 1* is shown in FIG. 7.

Figure 8:
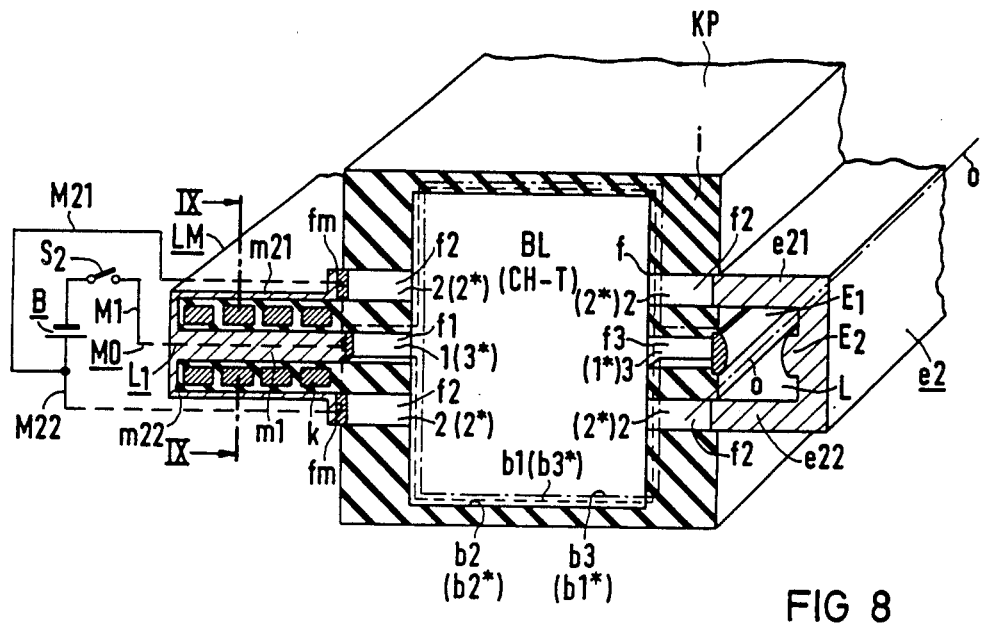
FIG. 8 is a fragmentary perspective view, partly broken away and in section, of a stripline capacitor packet, structurally combined with a laser chamber on the right-hand elongated side thereof and a reactor on the left-hand side thereof.
Figure 9:
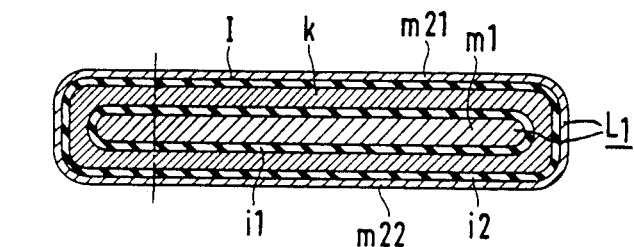
FIG. 9 is a cross-sectional view of FIG. 8 taken along the line IX—IX i.e. the inner current lead leg, which, with the interposition of insulating layers, is surrounded by the high-permeability winding of the core legs and the current return legs as the outer layer.
Figure 9A:
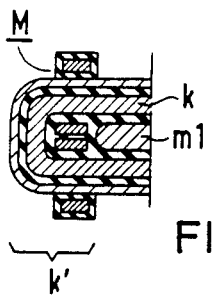
FIG. 9A is a fragmentary view of FIG. 9 showing a modified construction with elongation of the core legs.

FIGS. 8 and 9 show an advantageous embodiment of a compact structural unit on which all embodiments can be based, the embodiment (note FIG. 8) being formed of the laser chamber LK, the stripline capacitor packet KP combined therewith, and the fast high-voltage switches in the form of the saturable magnetic reactor LM which is associated with this packet on the other long side and is combined therewith. As is described in detail in German Published Non-Prosecuted Application (DE-OS) No. 29 32 781, note particularly FIGS. 2 and 3 therein as well as FIGS. 4 and 5, the stripline capacitors $C_1$, $C_2$ (according to the previous FIGS. 3 to 5) and $C_1*$, $C_2*$ (in accordance with the previous FIGS. 6 and 7), in the compact arrangement according to FIG. 8, extend with their electrodes and intermediately disposed dielectric layers substantially normal to the optical axis o—o of the laser chamber LK, and are stacked substantially parallel to the laser axis and to the capacitor packet KP, and are connected to terminal lugs, which extend out laterally and are generally identified by reference character f (a direct connection is also possible) within the pulse-forming network PFN to the laser chamber LK with the two electrodes $E_1$ and $E_2$ thereof as well as to the reactor LM at the current carrying legs m1 and to the current return leg m2 thereof, formed of the upper and the lower leg sections m21, m22.

In the special case, the terminal lugs f bear the numeral of the terminal points, at the potential of which they are disposed: Thus, the terminal lug f3 leads to the laser electrode $E_1$, and the metallic current returns e21, e22 of the current return (generally identified by reference character $E_2$) of the laser chamber LK are contacted by the terminal lugs f2. The insulating material mass, generally identified by reference character i, of the capacitor packet KP also serves to provide a sealed connection of the laser chamber LK. The capacitor electrodes b1 to b3 for the Blümlein circuit BL, which correspond as to the numerals thereof likewise to the terminal points 1 to 3, besides being used in FIG. 8, are also introduced into FIGS. 3 to 5; the designations b1* to b3* (in FIG. 8) of the capacitor electrodes and 1* to 3* of the terminal points of the charge transfer circuit CH-T are also employed in FIGS. 6 and 7. The dielectric between the individual electrodes b2 (solid contour), b1 (broken-line contour) and b3 (dot-dash line contour) of the capacitor electrodes which are repeated in regular sequence as seen over the stack length of the packet KP, may likewise be formed of insulating material; in principle, however, as explained heretofore in German Published Non-Prosecuted Application (DE-OS) No. 29 32 781, it can also be a water capacitor or a capacitor with another suitable liquid dielectric. As is apparent, the laser chamber LK is arranged at the one long side of the capacitor packet KP of rectangular cross section. Preferably, the saturable reactor LM is arranged at the other long side of the capacitor packet KP, as shown in FIG. 8. The switch connection of the working winding $L_1$ of the reactor to the stripline capacitor electrodes b2 and b1, respectively, is accomplished via the terminal lugs f2 and f1, respectively, on the one hand via the central elongated current lead legs m1 parallel to the laser axis (note also the section according to FIG. 9) and, on the other hand, via a respective off-center current return leg m21, m22 elongated in the direction parallel to the laser axis, the current return legs m21, m22 extending largely bifilar to the current lead leg m1 and being otherwise arranged in the cavities between the two current return legs m21, m22, on the one hand, and the current lead leg m1, on the other hand, with the interposition of insulating layers i1, i2, which are wound, in particular, of high-permeability tape material which is as thin as possible and insulated on one side, in the core leg k of the reactor LM which is closed in itself and encompasses the current lead leg m1. In the region of the terminal points fm of the current return legs m21, m22, these are connected at an angle forming contact strips, and two corresponding counter-contact surfaces of the terminal lugs f2 of the capacitor packet KP making contact, for example, by screw connections and/or soldering. Also, the contacts of the current lead leg m1 are effected areally at corresponding counter-contact surfaces fm of the contact lugs f1.

By the lines generally identified by reference character Mo and shown broken in the vicinity of the reactor LM in the left-hand part of FIG. 8, there is indicated that the turns of the control winding M may surround the reactor core legs k, closed in themselves, whereby the circuit with an external d-c voltage source B can be closed via the upper and the lower current returns M21, M22, and the central current lead M1 by the switch $S_2$. The individual turns of the control winding M can be guided, as indicated, through the current-lead leg m1 and can be returned outside the core length k back to the control current supply B; in addition thereto or in lieu thereof, however, it is also possible to extend the core legs k, which are closed in themselves, in the direction of the sectional plane IX—IX and to attach the control winding M to this extended leg branch K' as is indicated at the bottom in FIG. 9.

The arabic numerals 1 to 3 of the contact lugs f1 to f3 and of the capacitor electrodes b1 to b3 correspond to the terminal points of the corresponding Blümlein circuit BL according to FIGS. 3 to 5; by the reference character CH-T put in parentheses, of the charge transfer circuit according to FIGS. 6 and 7, there is indicated that the arrangement according to FIG. 8 can also be used for this circuit. In this case, the corresponding terminal points of the charge transfer circuit CH-T, namely 1* to 3* are put in parentheses next to the numerals of the corresponding terminal points of the Blümlein circuit BL, and the same for the identification of the corresponding capacitor electrodes b1* to b3*. The identification of the terminal lugs f for the charge transfer circuit CH-T was not changed in FIG. 8.

The illustration according to FIGS. 8 and 9 should be considered as an embodiment for a compact arrangement of a stripline capacitor packet KP with the laser chamber LK and the magnetic switch in the form of the reactor LM. This is a particularly advantageous embodiment. In principle, however, a capacitor packet KP could also be provided, the stripline capacitor electrodes of which may have, instead of a rectangular base area, for example, a pentagonal, hexagonal or n-sided base area, or a circular or oval base area. It would also be possible to arrange on the outer circumference of such a packet several laser chambers LK and several reactors LM.

The foregoing is a description corresponding in substance to German Application No. P 32 40 372.0, dated Nov. 2, 1982, the International priority of which is being claimed for the instant application, and which is hereby made part of this application. Any material discrepancies between the foregoing specification and the aforementioned corresponding German application are to be resolved in favor of the latter.

We claim:

1. Excitation system for generating a fast pulsed high-voltage discharge into a load, especially for exciting a high-power laser, by an arc-free capacitor discharge which is as homogeneous as possible, the system having:
   (a) a laser chamber including a gas space, at least two laser electrodes enclosed in the laser chamber, disposed opposite and spaced from one another, the electrodes extending parallel to an optical axis of the laser chamber and an electrode path connecting said laser electrodes; and
   (b) a high-voltage supply unit; and
   (c) a pulse forming network
      (c1) connectible on the input side to the high-voltage supply unit and connected on the output side to the laser electrodes;
      (c2) having serially connected first and second stripline capacitors connected in parallel with the electrode path of the laser;
   the pulse-forming network further comprising a plurality of shunt branches, including a given shunt branch connected in series with each of the stripline capacitors, at least one fast high-voltage switching element, due to the activation of which via the pulse-forming network, the high-voltage pulses at the lase electrodes are generatable, said fast high-voltage switching element being formed as a saturable magnetic reactor having a magnetizing current making the reactor go into saturation in response to the charging voltage across the stripline capacitors rising to nearly the peak value thereof, thereby forming a series circuit encompassing said first and second stripline capacitor and the laser electrode path.

2. Excitation system according to claim 1 wherein said pulse-forming network is based upon a Bluemlein circuit.

3. Excitation system according to claim 1 further comprising a low-impedance choke in parallel connection with said laser chamber.

4. Excitation system according to claim 2, wherein said high-voltage supply unit includes a first high-voltage supply system connected, via an intermediate-storage capacitor, in a shunt branch, as well as a series circuit including a switch and a series choke, in a series branch to a remaining part of the pulse-forming network in a Bluemlein circuit, and a second high-voltage supply system similar to said first high-voltage supply system connected via an intermediate-storage capacitor in a shunt circuit, and a series circuit including another switch and another series choke in a series branch to said Bluemlein circuit of the pulse-forming network.

5. Excitation system according to claim 4 wherein said laser chamber includes a laser head and wherein said second high-voltage supply unit is connected to the two poles of one of the stripline capacitors which is connected in series with said laser head and forms a shunt branch.

6. Excitation system according to claim 5 wherein said second high-voltage supply unit is decoupled a-c-wise via low pass filters from the high-voltage pulse occuring at said laser head and said one stripline capacitor serially connected therewith.

7. Excitation system according to claim 6 wherein both said switches connecting said first and second high-voltage supply systems to the pulse-forming network are electronic switches, and said electronic switches have control means for firing them simultaneously, the charging times of respective first and second charging loops for said high-voltage supply systems being matched to one another via said series chokes in accordance with the following equation:

$$t_{L2} = \pi \sqrt{L_0' \frac{C_0' \cdot C_2}{C_0' + C_2}} = t_{L1} = \pi \sqrt{L_0 \frac{C_0 \cdot C_1}{C_0 + C_1}}$$

wherein $t_{L1}$ and $t_{L2}$ are the charging times of the respective first and second charging loops, $L_o$ and $L_o'$ are the series inductances of the respective first and second charging loops, $C_o$ and $C_o'$ are the capacitances of the respective first and second charging loops, and $C_1$ and $C_2$ are the respective first and second stripline capacitors.

8. Excitation system according to claim 1 wherein the pulse-forming network is based upon a charge transfer circuit.

9. Excitation system according to claim 8 wherein said laser chamber includes a laser head and wherein said high-voltage supply unit is decoupled a-c-wise via lowpass filters from the high-voltage pulse occurring at said laser head and a first one of said stripline capacitors connected in series therewith.

10. Excitation system according to claim 8 wherein said high-voltage supply unit includes a first high-voltage supply system connected via an intermediate-storage capacitor in a shunt branch as well as a series circuit including a switch and a series choke in a series branch, to a remaining part of the pulse-forming network and, in addition to said first high-voltage supply system, a second and similar high-voltage supply system is connected via an intermediate-storage capacitor in a shunt branch and via a series circuit including another switch and another series choke in a series branch as well as an additional capacitor in a further shunt branch to a shunt branch of the reactor.

11. Excitation system according to claim 10 wherein both said switches respectively connecting said high-voltage supply system to the pulse-forming network are electronic switches, said electronic switches having control means for firing them simultaneously, the charging time of a second charging loop containing said second high-voltage supply system and mainly furnishing the magnetizing current of the reactor, and the charging time of a charging loop serving for charging one of said stripline capacitor and containing the first high-voltage supply system being equal in accordance with the following equation as a first approximation:

$$t_{L2}^* = t_{L1}^* = \pi \sqrt{L_0' \frac{C_0' \cdot C_3}{C_0' + C_3}} = \pi \sqrt{L_0 \frac{C_1^* \cdot C_0}{C_1^* + C_0}}$$

wherein $t_{L1}^*$ and $t_{L2}^*$ are the charging times of the respective first and second loops, $L_o$ and $L_o'$ are the series inductances of the respective first and second charging loops, $C_o$ and $C_o'$ are the capacitances of the respective first and second charging loops, $C_1^*$ is the capacitance of the first stripline capacitor and $C_3$ is the capacitance of said additional capacitor in said shunt branch to a shunt branch of the reactor.

12. Excitation system according to claim 11 wherein energy $C_o' \times (U^2/2)$ stored in said intermediate-storage capacitor of said charging loop containing said second high-voltage supply system being somewhat higher than the energy $L_1 \times (I^2/2)$ required for magnetizing the reactor.

13. Excitation system according to claim 1 wherein the laser chamber includes a laser head, a structural unit being formed of the laser head and corresponding first and second stripline capacitors, said stripline capacitors having electrodes and dielectric layers therebetween arranged substantially normal to the optical axis of the laser chamber and stacked substantially parallel to the laser axis to form a capacitor packet, the stripline capacitors being connected in the pulse-forming network, the laser chamber being arranged at a long side of said capacitor packet, a saturable reactor being arranged at another long side of said capacitor packet and a switched connection of a working winding of said reactor to said stripline capacitor electrodes via a central elongated current lead leg extending parallel to the laser axis, a current return being via a respective current return leg extending off-center parallel to the laser axis, the current return legs extend largely bifilar with respect to said current lead leg and being arranged in hollow spaces between the two current return legs, and said current lead leg, with an interposition of insulating layers, the reactor having core legs closed in themselves, and wound by tape material arranged so as to enclose said current lead leg.

14. Excitation system according to claim 13 wherein said stripline capacitor electrodes have a rectangular shape and said capacitor has a prismatic shape, said saturable reactor being arranged on the long side of the capacitor packet opposite said laser head.

15. Excitation system according to claim 13 wherein said control winding has turns surrounding said core legs of said reactor on a protruding loop section of said core legs, said control winding turns extending through the current lead leg and being returned outside said core legs to the control current supply.

16. Excitation system according to claim 2, including a switch having one pole thereof at ground potential and being connected in a series circuit also including an intermediate-storage capacitor and a series choke, said series circuit being connected in parallel with a reactor and in parallel with a first stripline capacitor and, within a second charging loop, a series circuit formed of another switch and another series choke is disposed in a "lower" series branch connected to ground via an impedance connected in parallel with the laser chamber in a manner that, corresponding to a switching element sequence of the first charging loop, the switching element sequence of the second charging loop is obtained.

17. Excitation system according to claim 16 wherein said impedance connected in parallel with the laser chamber is high, and is in particular, a resistor with a resistance which is high as compared to the choke.

* * * * *